(12) United States Patent
Chung et al.

(10) Patent No.: US 10,312,003 B2
(45) Date of Patent: Jun. 4, 2019

(54) CIRCUIT BOARD WITH THERMAL PATHS FOR THERMISTOR

(71) Applicant: FAIRCHILD KOREA SEMICONDUCTOR LTD., Bucheon (KR)

(72) Inventors: BongGeun Chung, Incheon (KR); YoonJoo You, Jeonju (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 19 days.

(21) Appl. No.: 15/388,322

(22) Filed: Dec. 22, 2016

(65) Prior Publication Data

US 2017/0207008 A1    Jul. 20, 2017

Related U.S. Application Data

(60) Provisional application No. 62/280,303, filed on Jan. 19, 2016.

(51) Int. Cl.
| | |
|---|---|
| *H05K 1/02* | (2006.01) |
| *H01C 7/04* | (2006.01) |
| *H05K 1/18* | (2006.01) |
| *H01R 12/58* | (2011.01) |
| *H05K 3/34* | (2006.01) |

(52) U.S. Cl.
CPC .............. *H01C 7/04* (2013.01); *H05K 1/0201* (2013.01); *H01R 12/58* (2013.01); *H05K 1/181* (2013.01); *H05K 1/182* (2013.01); *H05K 3/3447* (2013.01); *H05K 2201/10022* (2013.01); *H05K 2201/10196* (2013.01)

(58) Field of Classification Search
None
See application file for complete search history.

(56) References Cited

U.S. PATENT DOCUMENTS

| | | | | |
|---|---|---|---|---|
| 3,176,108 | A * | 3/1965 | Watson | H01H 1/26 |
| | | | | 200/266 |
| 5,338,435 | A * | 8/1994 | Betts | A61B 5/15003 |
| | | | | 204/406 |
| 2002/0011918 | A1* | 1/2002 | Miyazaki | H01C 1/01 |
| | | | | 338/22 R |
| 2013/0307560 | A1* | 11/2013 | Horie | H05K 1/111 |
| | | | | 324/537 |
| 2015/0138735 | A1* | 5/2015 | Oh | H01R 12/7082 |
| | | | | 361/736 |
| 2017/0103852 | A1* | 4/2017 | Ando | H01G 4/002 |

* cited by examiner

*Primary Examiner* — Junhee J Lee
*Assistant Examiner* — Xanthia C Cunningham
(74) *Attorney, Agent, or Firm* — Dickinson Wright PLLC

(57) ABSTRACT

A circuit board for an electronic device includes pattern areas on both sides of the circuit board. Each end of a thermistor is electrically connected to electrically conductive pads on pattern areas on the top and bottom sides of the circuit board. An input plug is electrically connected to an end of the thermistor. The input plug is electrically connected to the thermistor by way of an input connector to which the circuit board is inserted.

20 Claims, 5 Drawing Sheets

US 10,312,003 B2

CIRCUIT BOARD WITH THERMAL PATHS FOR THERMISTOR

CROSS-REFERENCE TO RELATED APPLICATION

This application claims the benefit of U.S. Provisional Application No. 62/280,303, filed Jan. 19, 2016, which is incorporated herein by reference in its entirety.

BACKGROUND OF THE INVENTION

1. Field of the Invention

The present invention relates generally to electronic devices, and more particularly but not exclusively to thermistors.

2. Description of the Background Art

A thermistor is a resistor with a resistance that varies with temperature. A negative temperature coefficient (NTC) thermistor is a type of thermistor whose resistance decreases as the temperature increases. An NTC thermistor may be used for inrush current limiting, temperature sensing, and other applications. When employed to limit inrush current, the temperature of the NTC thermistor can get very high, thereby degrading the NTC thermistor or causing a possible user-safety issue. A sealant (e.g., silicon sealant) may be applied over the NTC thermistor to limit its temperature increase. However, using a sealant increases the overall costs of the electronic device containing the NTC thermistor and may increase the temperature of other components connected to the NTC thermistor.

SUMMARY

In one embodiment, a circuit board for an electronic device includes pattern areas on both sides of the circuit board. Each end of a thermistor is electrically connected to electrically conductive pads on pattern areas on the top and bottom sides of the circuit board. An input plug is electrically connected to an end of the thermistor. The input plug is electrically connected to the thermistor by way of an input connector to which the circuit board is inserted.

These and other features of the present invention will be readily apparent to persons of ordinary skill in the art upon reading the entirety of this disclosure, which includes the accompanying drawings and claims.

The use of the same reference label in different drawings indicates the same or like components. The figures are not drawn to scale.

DETAILED DESCRIPTION

In the present disclosure, numerous specific details are provided, such as examples of devices, components, circuits, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
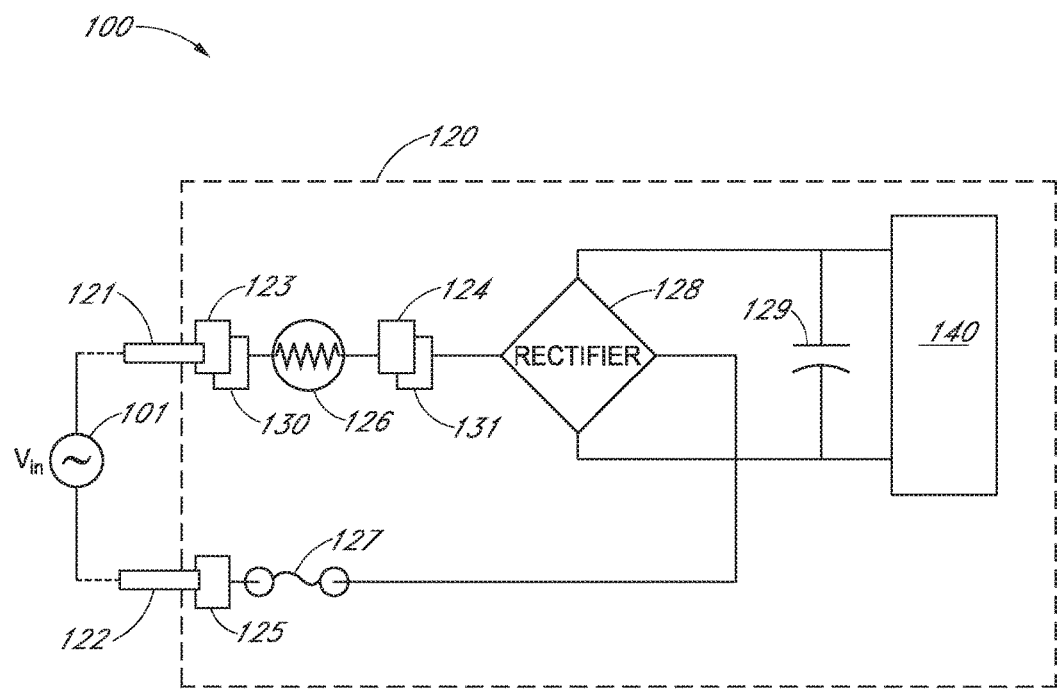
FIG. 1 shows a schematic diagram of an electronic device in accordance with an embodiment of the present invention.

FIG. 1 shows a schematic diagram of an electronic device 100 in accordance with an embodiment of the present invention. The electronic device 100 may be a travel power adapter or some other device. In the example of FIG. 1, the electronic device 100 includes a printed circuit board 120 and input plugs 121 and 122. The input plugs 121 and 122 may comprise a metal. A plurality of components may be mounted on the circuit board 120. In the example of FIG. 1, an NTC thermistor 126, a fuse 127, a rectifier 128, a capacitor 129, and components of a circuit 140 are mounted on the circuit board 120. As can be appreciated, the types, number, and interconnections of the components mounted on the circuit board 120 depend on the function of the electronic device 100.

In the example of FIG. 1, a first end of the NTC thermistor 126 is electrically connected to the input plug 121 by way of electrically conductive pads on the pattern areas 123 and 130, and a second end of the NTC thermistor 126 is electrically connected to the rectifier 128 by way of electrically conductive pads on the pattern areas 124 and 131. A first end of the fuse 127 may be electrically connected to the input plug 122 by way of an electrically conductive pad on a pattern area 125. The second end of the fuse 127 may be electrically connected to the rectifier 128. An electrical connection between an input plug and a conductive pad on a pattern area may be by way of an input connector, for example.

Generally speaking, the pattern areas 123, 124, 125, 130, 131 and other pattern areas may comprise areas on the circuit board 100 that are completely or partially occupied by electrically conductive pads, such as solder pads. In one embodiment, the pattern areas 123 and 124 are on one side (e.g., top side) of the circuit board 120, and the pattern areas 130 and 131 are on the opposing side (e.g., bottom side) of the circuit board 120. The pattern area 125 may be on either side of the circuit board 120.

Figure 2:
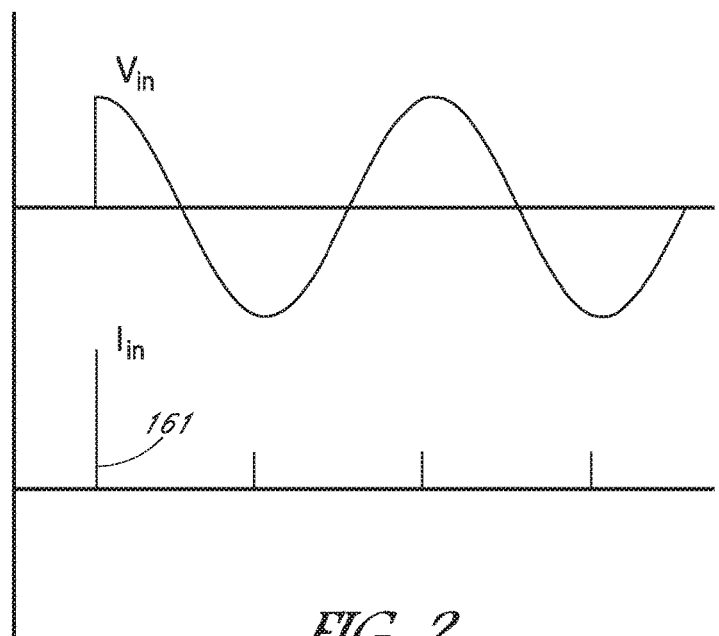
FIG. 2 shows waveforms of a power source that is applied to the electronic device of FIG. 1.

In the example of FIG. 1, the electronic device 100 may be plugged into a power source 101 by way of the input plugs 121 and 122. The power source 101 may be an AC power source (e.g., from a wall electrical outlet) that provides an input voltage VIN and a corresponding input current $I_{IN}$. As shown in the waveforms of FIG. 2, the input current may be much higher when the input voltage is suddenly supplied to the electronic device 100. This inrush current (FIG. 2, 161) may damage the components of the electronic device 100. One way of limiting the inrush current is to increase the resistance of the NTC thermistor 126. However, increasing the resistance of the NTC thermistor 126 increases power loss, which increases the operating temperature of the NTC thermistor 126. The increased operating temperature may decrease the lifetime of the electronic device 100 and may cause injuries to users. The increased operating temperature may be alleviated by using a sealant (e.g., silicon sealant) to cover the NTC thermistor 126, but this raises the manufacturing cost of the electronic device 100.

Figure 3:
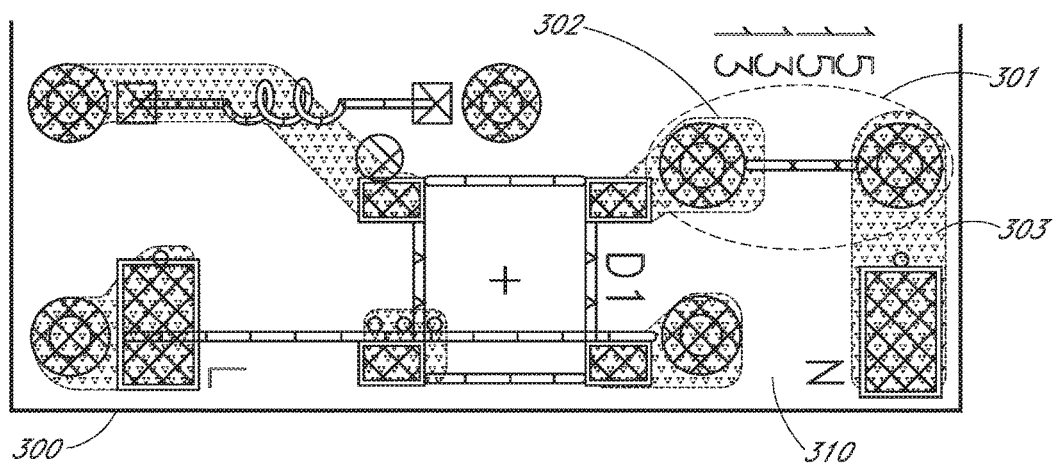
FIGS. 3 and 4 show a bottom side and a top side, respectively, of an example printed circuit board that may contain a thermistor.
Figure 4:
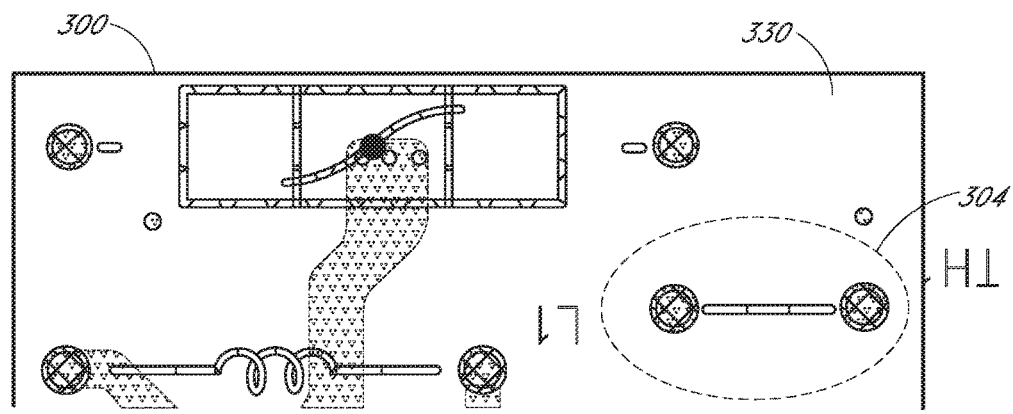

FIGS. 3 and 4 show a bottom side 310 and a top side 330, respectively, of an example printed circuit board 300. In the example of FIG. 3, a first end of an NTC thermistor is electrically connected to an electrically conductive pad on a pattern area 302 on the bottom side 310, and a second end of the NTC thermistor is electrically connected to an electrically conductive pad on a pattern area 303 on the bottom side 310. The region 301 indicates the general location where the NTC thermistor is mounted on the top side 330. As shown in FIG. 4, there is no pattern area for the NTC thermistor on the top side 330. In FIG. 4, the region 304 generally indicates the area where the NTC thermistor is physically mounted. A sealant is typically employed to limit the temperature of the NTC thermistor on the circuit board 300.

Figure 5:
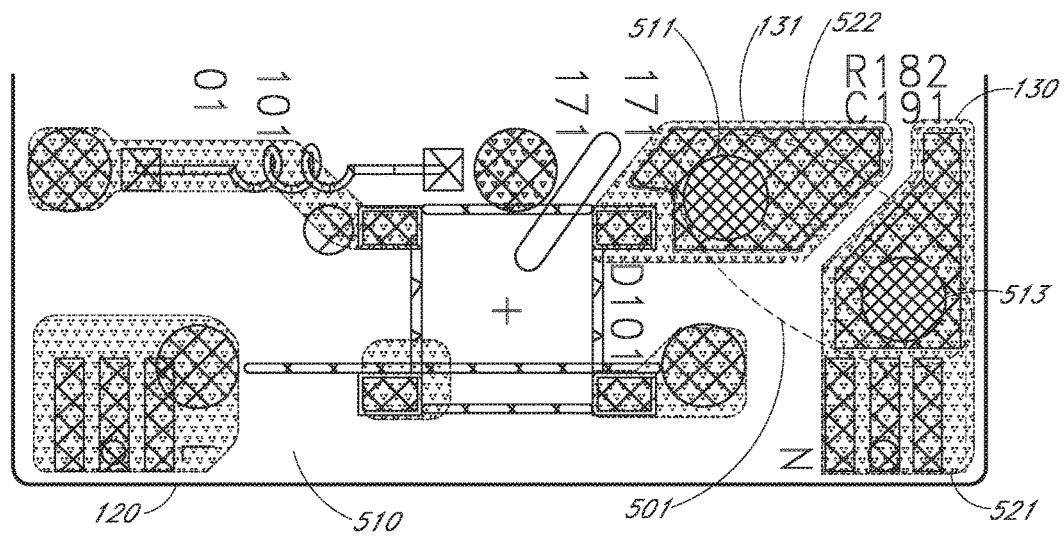
FIGS. 5 and 6 show a bottom side and a top side, respectively, of a printed circuit board that may contain a thermistor in accordance with an embodiment of the present invention.
Figure 6:
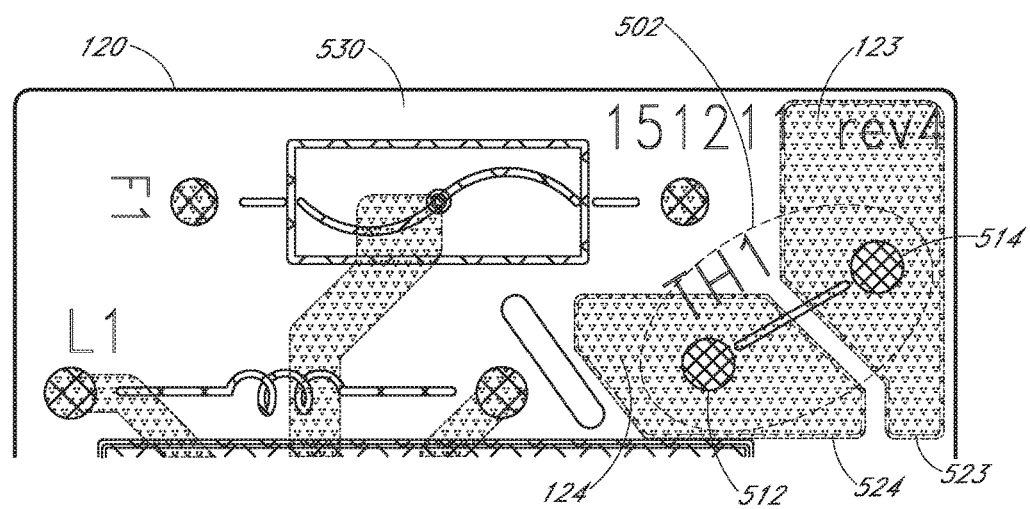

FIGS. 5 and 6 show a bottom side 510 and a top side 530, respectively, of the printed circuit board 120 (FIG. 1, 120) in accordance with an embodiment of the present invention. In the example of FIG. 5, a first end of the NTC thermistor 126 (FIG. 1, 126) is electrically connected to an electrically conductive pad 521 on the pattern area 130 on the bottom side 510, and a second end of the NTC thermistor is electrically connected to an electrically conductive pad 522 on the pattern area 131 on the bottom side 510. The region 511 indicates the general location where the NTC thermistor 126 is mounted on the top side 530.

Generally speaking, the area and shape of an electrically conductive pad (e.g., pads 521-524) on a pattern area (e.g., areas 130, 131, 123, and 124) can vary depending on the amount of space on the circuit board. An electrically conductive pad may comprise a solder pad. A component, such as the NTC thermistor 126, may be electrically connected to a solder pad by soldering. In the example of FIGS. 5 and 6, a via (e.g., FIG. 9, via 750) has an opening 513 (FIG. 5, 513) on the bottom side 510 and a corresponding opening 514 (FIG. 6, 514) on the front side 530. Similarly, another via may have an opening 511 (FIG. 5, 511) on the bottom side 510 and a corresponding opening 512 (FIG. 6, 512) on the top side 530. Solder pads from one side to the other side of the circuit board 120 may be electrically connected through vias. For example, the electrically conductive pad 521 on the bottom side 510 may be electrically connected to the electrically conductive pad 523 on the front side 530 by way of the via having the openings 513 and 514. Similarly, the electrically conductive pad 522 on the bottom side 510 may be electrically connected to the electrically conductive pad 524 on the front side 530 by way of the via having the openings 511 and 512. In general, the number of vias and electrically conductive pads on the circuit board 120 may be increased to provide more thermal paths for the NTC thermistor 126.

Referring to FIG. 6, the top side 530 of the circuit board 120 includes the pattern areas 123 and 124. In the example of FIG. 6, the electrically conductive pad 523 is on the pattern area 123 and the electrically conductive pad 524 is on the pattern area 124. In one embodiment, the front edge portion of the circuit board 120 may be inserted into an input connector (e.g., FIG. 9, input connector comprising 751-1 and 751-2) such that the electrically conductive pads 521 (FIGS. 5, 521) and 523 (FIG. 6, 523) make electrical contact to the input connector. The input connector, in turn, may be electrically connected to an input plug (FIG. 1, 121 or 122). In the example of FIG. 6, the region 502 indicates the general location where the NTC thermistor 126 is mounted on the front side 530.

By having pattern areas and corresponding electrically conductive pads for the NTC thermistor 126 on both the bottom side 510 and the front side 530, the amount of solder that can be used to electrically connect and mount the NTC thermistor 126 on the circuit board 120 is increased. The increased amount of solder and area of the conductive pads for the NTC thermistor 126 decreases the operating temperature of the NTC thermistor 126 without necessarily using a sealant. The operating temperature of the NTC thermistor 126 may be further reduced by increasing the volume of the corresponding input plug, which acts as heat sink. In one embodiment, the input plug 121 that is electrically connected to the NTC thermistor 126 has a volume 0.22 cm$^3$, thereby providing the NTC thermistor 126 a 0.22 cm$^3$ heat sink.

Figure 7:
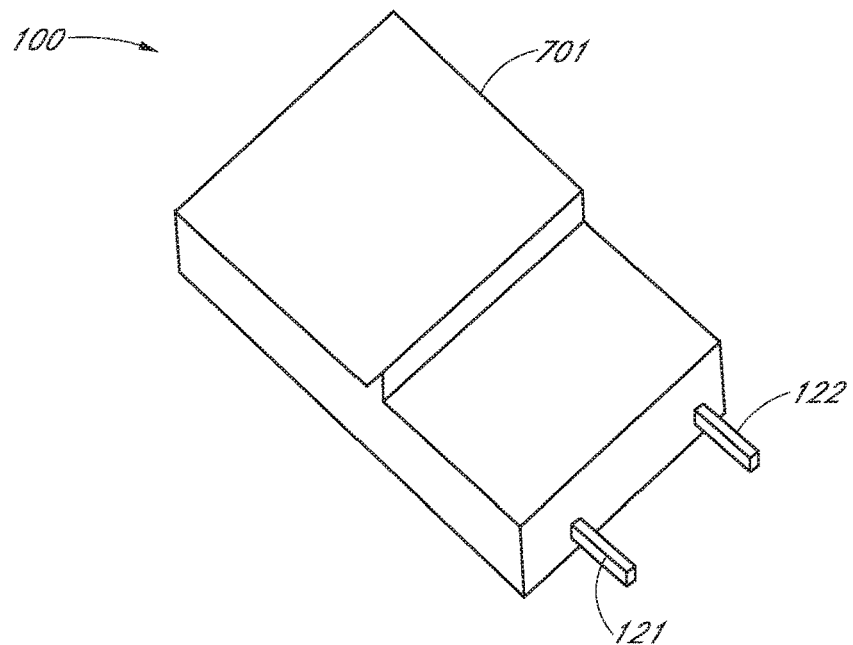
FIG. 7 shows a perspective view of the electronic device of FIG. 1 in accordance with an embodiment of the present invention.
Figure 8:
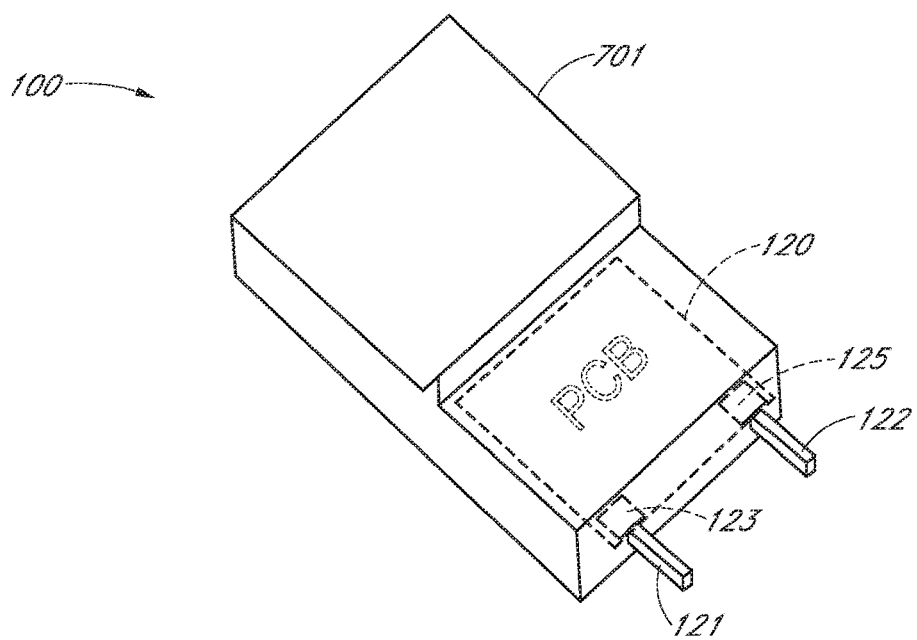
FIG. 8 shows a see-through view of the electronic device of FIG. 1.

FIG. 7 shows a perspective view of the electronic device 100 in accordance with an embodiment of the present invention. In the example of FIG. 7, the electronic device 100 comprises an enclosure 701 that houses the circuit board 120 (FIG. 1, 120). The input plugs 121 and 122 extend out the enclosure 701. FIG. 8 shows a see-through view of the electronic device 100. As shown in FIG. 8, the circuit board 120 is enclosed within the enclosure 701. The input plug 121 is electrically connected at least to an electrically conductive pad on the pattern area 123 on the top side of the circuit board 120, and the input plug 122 is electrically connected to an electrically conductive pad on the pattern area 125 on the front side of the circuit board 120. As explained, in one embodiment, the input plug 121 is also electrically connected to an electrically conductive pad on a pattern area on the bottom side of the circuit board 120.

Figure 9:
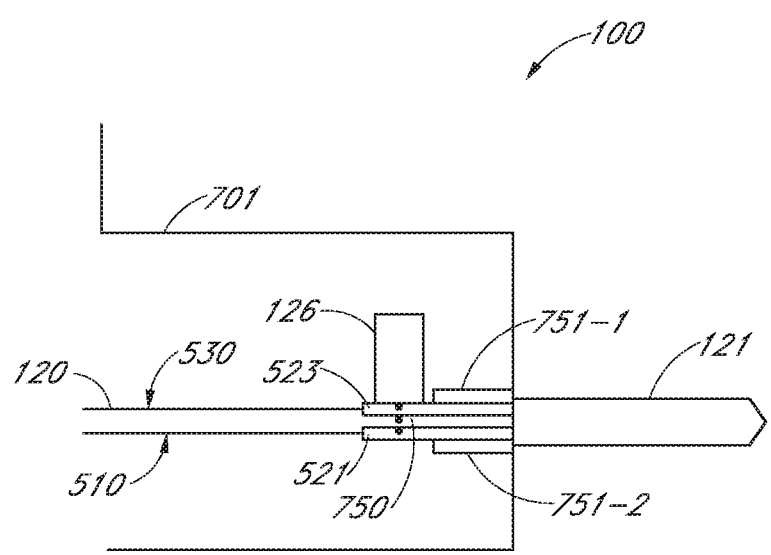
FIG. 9 schematically shows a side view of the electronic device of FIG. 1 in accordance with an embodiment of the present invention.

FIG. 9 schematically shows a side view of the electronic device 100 in accordance with an embodiment of the present invention. In the example of FIG. 9, the input lug 121 is electrically connected to an input connector comprising contacts 751-1 and 751-2. The circuit board 120 may be physically inserted into the input connector to make an electrical connection to the input plug 121. In the example of FIG. 9, the electrically conductive pad 523 on the pattern area 123 (see FIG. 6) on the top side 530 makes an electrical connection to the contact 751-1, which in turn is electrically connected to the input plug 121. Similarly, the electrically conductive pad 521 on the pattern area 130 (see FIG. 5) on the bottom side 510 makes an electrical connection to the contact 751-2, which in turn is electrically connected to the input plug 121. In the example of FIG. 9, the NTC thermistor 126 is mounted on the top side 530. In one embodiment, an end of the NTC thermistor 126 is soldered to the electrically conductive pads 523 and 521, which are electrically connected together by way of a via 750. Providing the NTC thermistor 126 conductive pads on both sides of the circuit board 120 increases the thermal path of the NTC thermistor 126 to the input plug 121, which serves as a heat sink for the NTC thermistor 126. Accordingly, the operating temperature of the NTC thermistor 126 can be limited without applying a sealant on the NTC thermistor 126.

Circuit boards with improved thermal paths for NTC thermistors have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A circuit board comprising:
   a first conductive pad on a top side of the circuit board;
   a second conductive pad on a bottom side of the circuit board;
   a thermistor mounted on the circuit board, the thermistor comprising a first end that is electrically connected to the first and second conductive pads and a second end that is electrically connected to a component that is mounted on the circuit board,
   an input plug:
   an input connector electrically coupled to the input plug, and the input connector comprising a first contact and a second contract; and
   the first contact coupled directly to the first conductive pad on the top side of the circuit board, and the second contact coupled directly to the second conductive pad on the bottom side of the circuit board.

2. The circuit board of claim 1, wherein the first and second conductive pads are solder pads and the thermistor is soldered onto the first and second conductive pads.

3. The circuit board of claim 1, wherein the thermistor is a negative temperature coefficient (NTC) thermistor.

4. The circuit board of claim 1, wherein the component that is electrically connected to the second end of the thermistor comprises a rectifier.

5. The circuit board of claim 1, further comprising a third conductive pad on the top side of the circuit board and a fourth conductive pad on the bottom side of the circuit board.

6. The circuit board of claim 5, wherein the second end of the thermistor is electrically connected to the third and fourth conductive pads.

7. The circuit board of claim 6, wherein the first, the second, the third, and the fourth conductive pads comprise solder pads, the first end of the thermistor is soldered to the first and second conductive pads, and the second end of the thermistor is soldered to the third and fourth conductive pads.

8. The circuit board of claim 1, wherein the thermistor is mounted on the top side of the circuit board.

9. The circuit board of claim 1 further comprising the input plug configured to act as a heat sink for the thermistor.

10. The circuit board of claim 9 wherein the input plug has a volume 0.22 cm$^3$.

11. An electronic device comprising:
    a printed circuit board comprising a top side and a bottom side, a first solder pad on the top side, a second solder pad on the bottom side, and a thermistor having a first end that is soldered to the first and second solder pads;
    an enclosure that houses the printed circuit board;
    an input plug that extends outward away from the enclosure;
    an input connector disposed within the enclosure and electrically coupled to the input plug, and the input connector comprising a first contact and a second contact;
    the first contacted coupled directly to the first solder pad on the top side of the printed circuit board, and the second contact coupled directly to the second solder pad on the bottom side of the circuit board.

12. The electronic device of claim 11, wherein the input plug extends out of the enclosure.

13. The electronic device of claim 11, wherein the thermistor comprises a negative temperature coefficient (NTC) thermistor.

14. The electronic device of claim 11, wherein the thermistor is mounted on the top side of the printed circuit board.

15. The electronic device of claim 11, wherein the printed circuit board further comprises a third conductive pad on the top side and a fourth conductive pad on the bottom side, and a second end of the thermistor is soldered to the third and fourth conductive pads.

16. The electronic device of claim 11 further comprising the input plug configured to act as a heat sink for the thermistor.

17. A circuit board comprising:
    a first pattern area on a top side of the circuit board;
    a second pattern area on a bottom side of the circuit board;
    a thermistor comprising a first end that is electrically connected to an electrically conductive portion on the first pattern area and to an electrically conductive portion on the second pattern area, the thermistor further comprising a second end that is electrically connected to an electrically conductive portion on a third pattern area;
    an input plug;
    an input connector electrically coupled to the input plug, and the input connector comprising a first electrical contact and a second electrical contact; and
    the first electrical contact coupled directly to the first pattern area on the top side of the circuit board, and the second electrical contact coupled directly to the second pattern area on the bottom side of the circuit board.

18. The circuit board of claim 17, wherein the first end of the thermistor is soldered to the electrically conductive portions on the first and second pattern areas.

19. The circuit board of claim 18, wherein the second end of the thermistor is soldered to the electrically conductive portion on the third pattern area on the top side of the circuit board and to an electrically conductive portion on a fourth pattern area on the bottom side of the circuit board.

20. The circuit board of claim 17 further comprising the input plug configured to act as a heat sink for the thermistor.

* * * * *

UNITED STATES PATENT AND TRADEMARK OFFICE
CERTIFICATE OF CORRECTION

PATENT NO. : 10,312,003 B2
APPLICATION NO. : 15/388322
DATED : June 4, 2019
INVENTOR(S) : Chung et al.

Page 1 of 1

It is certified that error appears in the above-identified patent and that said Letters Patent is hereby corrected as shown below:

In the Claims

Column 5
Claim 1, Line 14, "contract" should read --contact--

Column 6
Claim 11, Line 5, "contacted" should read --contact--

Signed and Sealed this
Twenty-fourth Day of December, 2019

Andrei Iancu
*Director of the United States Patent and Trademark Office*